(12) United States Patent
Wada et al.

(10) Patent No.: US 6,946,318 B2
(45) Date of Patent: Sep. 20, 2005

(54) METHOD OF FORMING GE PHOTODETECTORS

(75) Inventors: Kazumi Wada, Lexington, MA (US); Lionel C. Kimerling, Concord, MA (US); Yasuhiko Ishikawa, Cambridge, MA (US); Douglas D. Cannon, Somerville, MA (US); Jifeng Liu, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/952,055

(22) Filed: Sep. 28, 2004

(65) Prior Publication Data

US 2005/0040411 A1 Feb. 24, 2005

Related U.S. Application Data

(63) Continuation of application No. 10/307,779, filed on Dec. 2, 2002, now Pat. No. 6,812,495
(60) Provisional application No. 60/389,819, filed on Jun. 19, 2002.

(51) Int. Cl.[7] ............................................... H01L 21/00
(52) U.S. Cl. .............................. 438/94; 438/65; 438/91; 438/481; 438/483; 438/933; 257/18; 257/19; 257/22; 257/79; 257/80; 257/82; 257/103
(58) Field of Search ............................. 438/48, 57, 65, 438/69, 71, 91, 94, 478, 481, 483, 933; 257/1–192, 197

(56) References Cited

U.S. PATENT DOCUMENTS

| | | | | |
|---|---|---|---|---|
| 3,783,009 A | * | 1/1974 | Tramposch | 428/620 |
| 4,632,712 A | * | 12/1986 | Fan et al. | 117/89 |
| 5,091,333 A | * | 2/1992 | Fan et al. | 117/89 |
| 5,208,182 A | * | 5/1993 | Narayan et al. | 438/509 |
| 5,461,243 A | * | 10/1995 | Ek et al. | 257/190 |
| 5,659,187 A | * | 8/1997 | Legoues et al. | 257/190 |
| 5,759,898 A | * | 6/1998 | Ek et al. | 438/291 |
| 5,847,419 A | * | 12/1998 | Imai et al. | 257/192 |
| 6,222,200 B1 | * | 4/2001 | Svilans | 257/18 |
| 6,331,445 B1 | | 12/2001 | Janz et al. | |
| 6,649,492 B2 | * | 11/2003 | Chu et al. | 438/478 |
| 6,770,542 B2 | * | 8/2004 | Plossl et al. | 438/458 |
| 2003/0146428 A1 | | 8/2003 | Ma et al. | |
| 2003/0215990 A1 | * | 11/2003 | Fitzgerald et al. | 438/172 |

FOREIGN PATENT DOCUMENTS

| | | |
|---|---|---|
| EP | 0 224 189 | 11/1986 |
| EP | 0 940 854 | 2/1999 |

OTHER PUBLICATIONS

Masini et al., "High–Performance p–i–n Ge on Si Photodetectors for the Near Infrared: Fron Model to Demostration," Jun. 2001, vol. 48, No. 6.*

Masini et al., "High–Performance p–i–n Ge on Si Photodetectors for the Near Infrared: From Model to Demonstration," Jun. 2001, vol. 48, No. 6.*

"High–Performance p–i–n Ge on Si Photodetectors for the Near Infrared: From Model to Demonstration," Masini et al. *IEEE Transactions on Electron Devices.* Jun. 2001. vol. 48, No. 6.

"Structure, properties, and applications of GexSi1–x strained layers and superlattices," Jain et al. *Semiconductor Science and Technology.* Jul. 1991. No. 7.

* cited by examiner

*Primary Examiner*—Andy Huynh
(74) *Attorney, Agent, or Firm*—Goodwin Procter LLP

(57) ABSTRACT

A photodetector device includes a plurality of Ge epilayers that are grown on a substrate and annealed in a defined temperature range. The Ge epilayers form a tensile strained Ge layer that allows the photodetector device to operate efficiently in the C-band and L-band.

32 Claims, 6 Drawing Sheets

US 6,946,318 B2

METHOD OF FORMING GE PHOTODETECTORS

PRIORITY INFORMATION

This application claims priority from provisional application Ser. No. 60/389,819 filed Jun. 19, 2002, which is incorporated herein by reference.

This application is a continuation of U.S. patent application Ser. No. 10/307,779 filed on Dec. 2, 2002 now U.S. Pat. No. 6,812,495.

BACKGROUND OF THE INVENTION

The invention relates to the field of photodetectors, and in particular to monolithically integrated Ge photodetectors on Si.

Photodetectors are fundamental devices that convert optical signals into electric signals. Fiber optical communication employs 1300 and 1550 nm wavelengths because of low attenuation coefficients of silica fibers. Er doped fiber amplifiers emphasize the importance of 1550 nm because of the direct amplification of optical signals without converting to electric signals. The amplification range between 1530–1560 nm is referred to as C-band, and the recently extended amplification range between 1570–1608 nm is referred to as L-band. The photodetectors for 1550 nm detection have so far been InGaAs photodetectors, since InGaAs is a direct semiconductor whose bandgap is 0.75 eV (corresponding to 1653 nm). Thus, InGaAs photodetectors can convert any optical signal in the C- and L-bands to electric signals. These optical fiber communication components are well developed.

Recently, optical technology has expanded its territory from fiber communication to photonic integrated circuits on a chip. This allows for high speed and broad band communication. The impact is even larger if optics is merged into Si LSIs, e.g., 10 GHz clock processors, etc. InGaAs photodetectors are not easy to implement on a silicon chip, since InGaAs is a III-V compound semiconductor. In general, the elements In, Ga, and As are all dopants in silicon to show donor or acceptor characteristics and could thus alter the circuit performance if diffused. Ge can be a candidate for on-chip photodetectors, since Ge is in the group IV element and produces no harmful effects if diffused. Thus, Ge provides a perfect opportunity to form highly efficient photodetectors.

SUMMARY OF THE INVENTION

According to one aspect of the invention, there is provided a photodetector device. The photodetector device includes a plurality of Ge epilayers that are grown on a silicon substrate and annealed in a defined temperature range. The Ge epilayers form a tensile strained Ge layer that allows the photodetector device to operate efficiently in the C-band and L-band.

According to another aspect of the invention, there is provided a method of forming a photodetector device. The method includes forming a plurality of Ge epilayers that are grown on a substrate. Moreover, the method includes annealing the Ge epilayers in a defined temperature range. Furthermore, the method includes developing a tensile strained Ge layer using the annealed Ge epilayers, the tensile strained Ge layer allowing the photodetector device to operate efficiently in the C-band and L-band.

According to another aspect of the invention, there is provided a photodetector device. The photodetector device includes a plurality of SiGe epilayers that are grown on a substrate at a high temperature so as to form a SiGe structure. The SiGe layer forms a tensile strained SiGe layer by cooling to room temperature the SiGe structure using the bi-metal effect. The tensile strained SiGe layer allows the photodetector device to operate efficiently in the C-band and L-band.

According to another aspect of the invention, there is provided a method of forming a photodetector device. The method includes growing a plurality of SiGe epilayers on a silicon substrate at a high temperature so as to form a SiGe structure. Furthermore, the method includes forming a tensile strained SiGe layer by cooling to room temperature the SiGe structure using the bi-metal effect. The tensile strained SiGe layer allows the photodetector device to operate efficiently in the C-band and L-band.

DETAILED DESCRIPTION OF THE INVENTION

Ge is an indirect semiconductor whose bandgap is 0.667 eV corresponding to 1850 nm. Because of indirect bandgap characteristics, the absorption coefficient is small, approximately 100 $cm^{-1}$ depending on the wavelength. The direct bandgap of Ge is 0.8 eV corresponding to 1550 nm. Thus, the photodetector performance of Ge is marginally good in the C-band but, is poor in the L-band. To overcome the drawback of Ge, various attempts have been used, such as GeSn alloy, to decrease the bandgap.

One goal in Ge photodetectors is to shrink the bandgap to cover the C- and L-bands with high efficiency. The invention uses tensile strain to accomplish this task.

Figure 1:
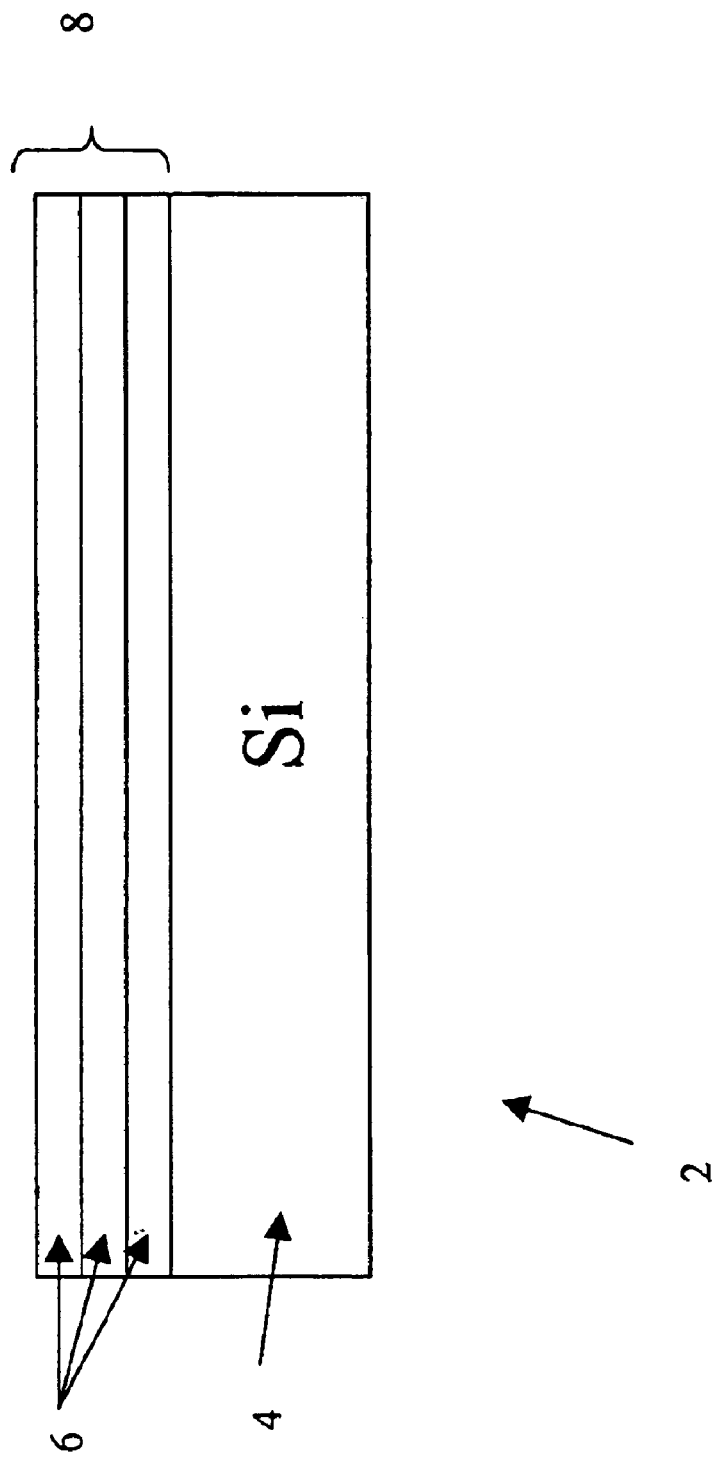
FIG. 1 is schematic block diagram illustrating the techniques used to create a Ge photodetector using a tensile strained Ge layer.

FIG. 1 is schematic block diagram illustrating the techniques used to create a Ge photodetector 2 using a tensile strained Ge layer 8. The Ge photodetector is formed on a Si wafer. This is ideal for realizing Si-based optoelectronic circuits as well as optical interconnection in Si-LSIs. In spite of a large lattice mismatch (4%) between Ge and Si, a layer 8 of Ge is grown directly on the Si wafer 4 with uniform thickness and with low density of threading dislocations, using an ultrahigh-vacuum chemical vapor deposition (UHV-CVD) technique. Other depositing techniques can be used in accordance with this invention.

By growing the Ge layer 8 directly on the Si, the bandgap shrinkage is shown to be induced by tensile strain. The Ge layer 8 includes a defined number of Ge epilayers 6, grown at 700° C. on the heavily-doped p-Si (100) wafer using the UHV-CVD technique, which also uses $GeH_4$ (15% in Ar) as the deposition gas. After the growth, cyclic thermal annealing (10 cycles between 900° C. and 700° C.) is performed to reduce the dislocation density. Absorption coefficients derived from responsibility spectra indicate substantial red shift compared with bulk Ge. It is shown from PR spectra that the red shift is induced by bandgap shrinkage. The Ge epilayers show approximately 0.77 eV, which is smaller by approximately 0.03 eV than direct bandgap for bulk Ge. This property is beneficial for Ge photodetectors that can operate in the C-band as well as the L-band. The origin of the shrinkage is found to be not by electric-field-enhanced tunneling such as Franz-Keldysh effect. The pseudo potential calculation suggests that the bandgap shrinkage would occur under tensile strain of approximately 0.2%. It is discussed that generation of such tensile strain is ascribed to the difference of thermal expansion between Ge and Si.

Furthermore, this method is applicable for not only Ge epilayers 6, but also SiGe where Ge concentration is more than 50% to introduce thermal mismatch. In the case of SiGe, the equilibrate temperature should be designed higher than 900° C. and preferably close to the melting temperature of the alloy. In this embodiment, Si is used as a substrate, however, other types of substrates can be used whose lattice expansion coefficient is smaller that Ge.

Another technique in creating tensile stress in Ge is to use the thermal mismatch between Ge and Si. The linear expansion coefficients of Ge and Si are $5.8 \times 10^{-6}$ $K^{-1}$ and $2.6 \times 10^{-6}$ $K^{-1}$, respectively. When the Ge epilayers 6 are grown on Si and then heat up to a high temperature after growth to equilibrate these lattices so as to have its own lattice constants, the tensile strain should be introduced in the Ge epilayers 6 by cooling to room temperature the SiGe structure in terms of the so called bi-metal effect.

Figure 2:
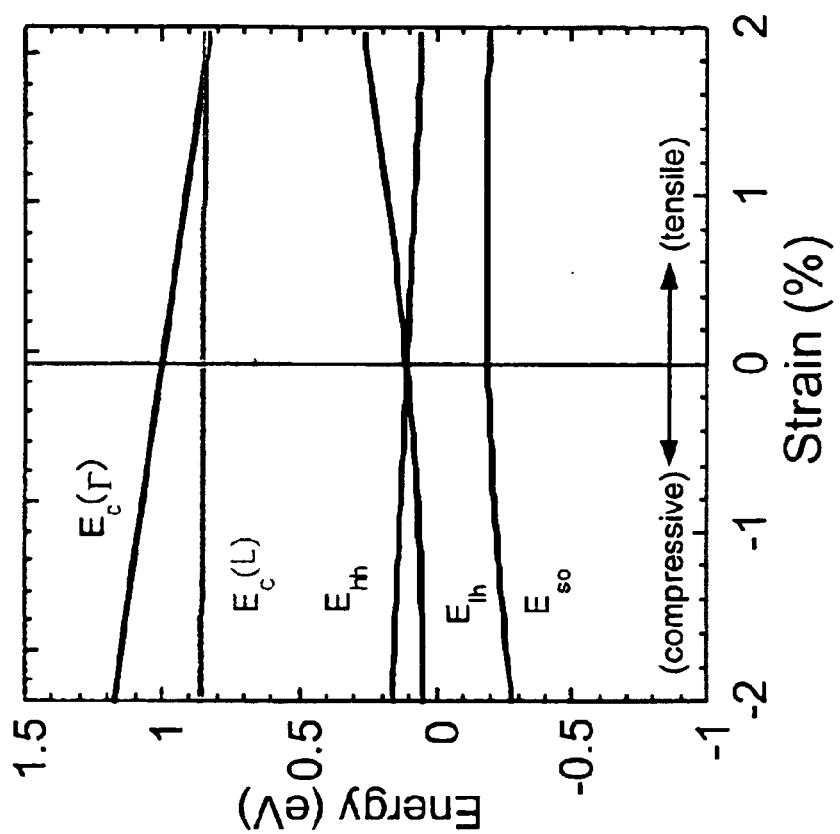
FIG. 2 is an energy band diagram of Ge under stress.
Figure 5:
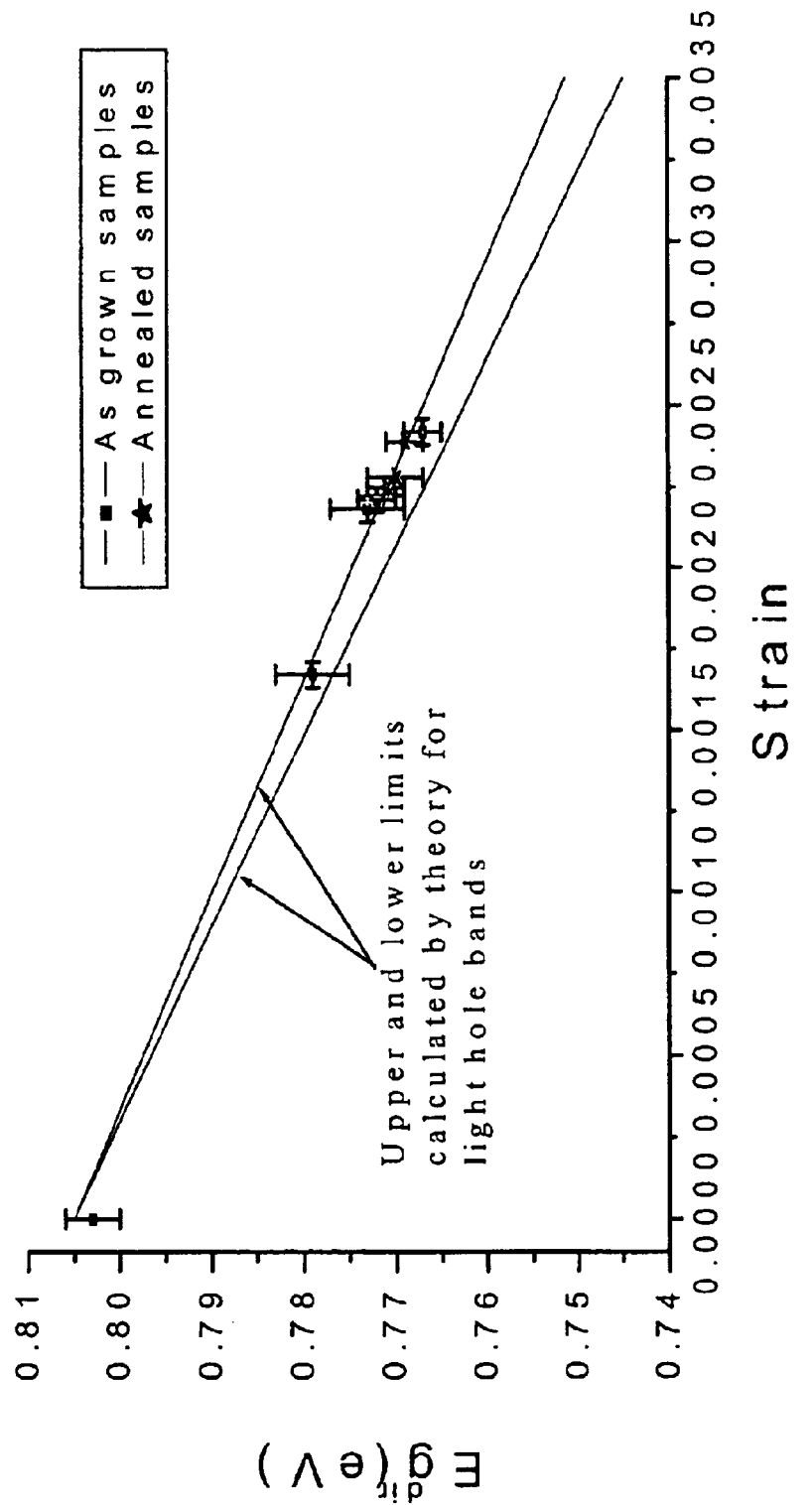
FIG. 5 is a graph demonstrating the tensile strain in Ge shrinking its direct bandgap (Eg)

According to this technique, isothermal annealing at 900° C. for 10 min or longer for Ge epilayers grown at 700 C is performed to fully relax the Ge lattice constant; Ge has its own lattice constant. Also isothermal annealing at 900° C. for 30 min or longer for Ge epilayers grown at 600° C. is needed to fully relax the Ge lattice constant. FIG. 5 shows the theoretical limit of the bandgap shrinkage using the bi-metal effect. It is assumed that rapid thermal annealing is used to cool the Ge epilayers instantaneously to room temperature. This technique of rapid cooling of the Ge epilayer on Si should be more effective than slow cooling, since lattice relaxation could happen in slower cooling. It shows the maximum strain 0.32% and the minimum bandgap 0.757 eV as shown in FIG. 2. It is marked that the bandgap corresponds to 1638 nm is much longer than the long wavelength edge of the L-band.

SiGe epilayers can also be grown using this technique. The isothermal annealing temperature can be approximately 1330° C. for $Si_{0.5}Ge_{0.5}$ epilayers.

FIG. 2 is an energy band diagram of Ge under stress. Pseudo potential calculations have been used. The band diagram shows that the Ge bandgap shrinks when tensile stress is induced. The Ge direct bandgap consists of G valley and degenerated hole bands. When the tensile stress is introduced, the energy position of the G valley is lowered and that of the light hole band is higher, eventually the direct bandgap shrinks. FIG. 2 also shows that the tensile stress of 0.2% is needed to shift the band edge up to 1600 nm to cover the L-band. As noted above our maximum strain is 0.32% and the band gap is 1638 nm which should cover the L band.

Figure 3:
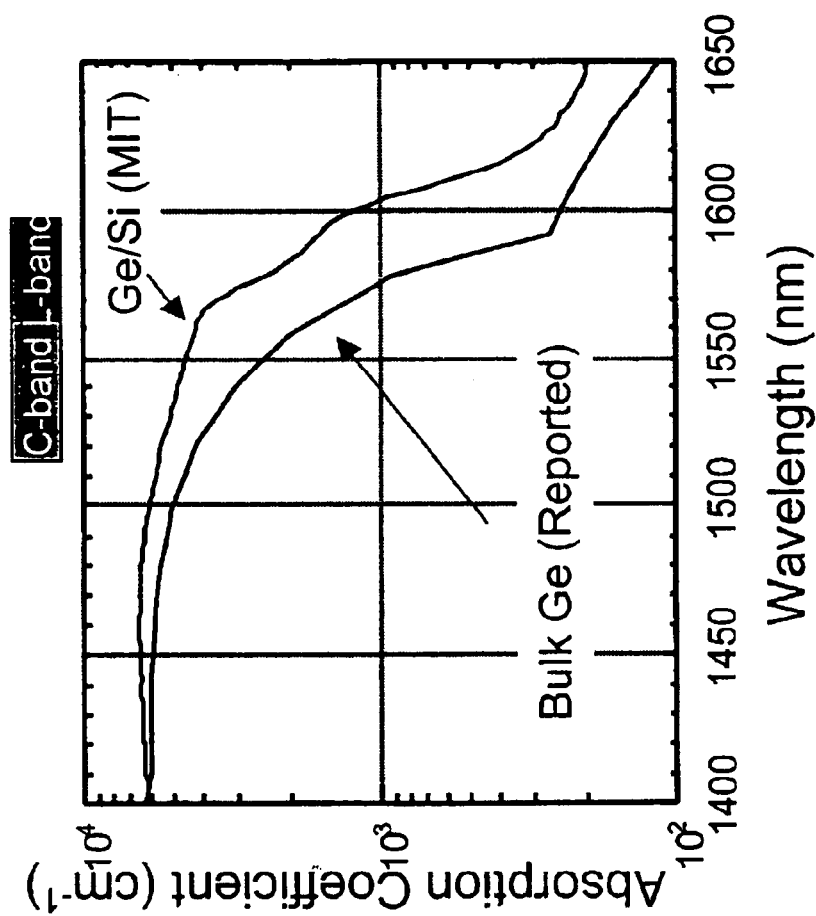
FIG. 3 is a graph of the absorption of a Ge epilayer grown using the invention.

FIG. 3 is a graph of the absorption of a Ge epilayer grown using the invention. In particular, the graph shows the absorption coefficients of the Ge epilayer grown using the invention and bulk Ge. Furthermore, the graph shows increase sensitivity up to 1600 nm between the C-band and L-band for the Ge epilayer. The Ge bulk does not demonstrate increase sensitivity in the C-band and practically no sensitivity in the L-band. Thus, using Ge epilayers as a tensile Ge layer can be beneficial for operations in the C-band and L-band with sufficient sensitivity. Using rapid thermal annealing the Ge epilayers can be cooled rapidly, leading further shrinkage of the bandgap.

Figure 4:
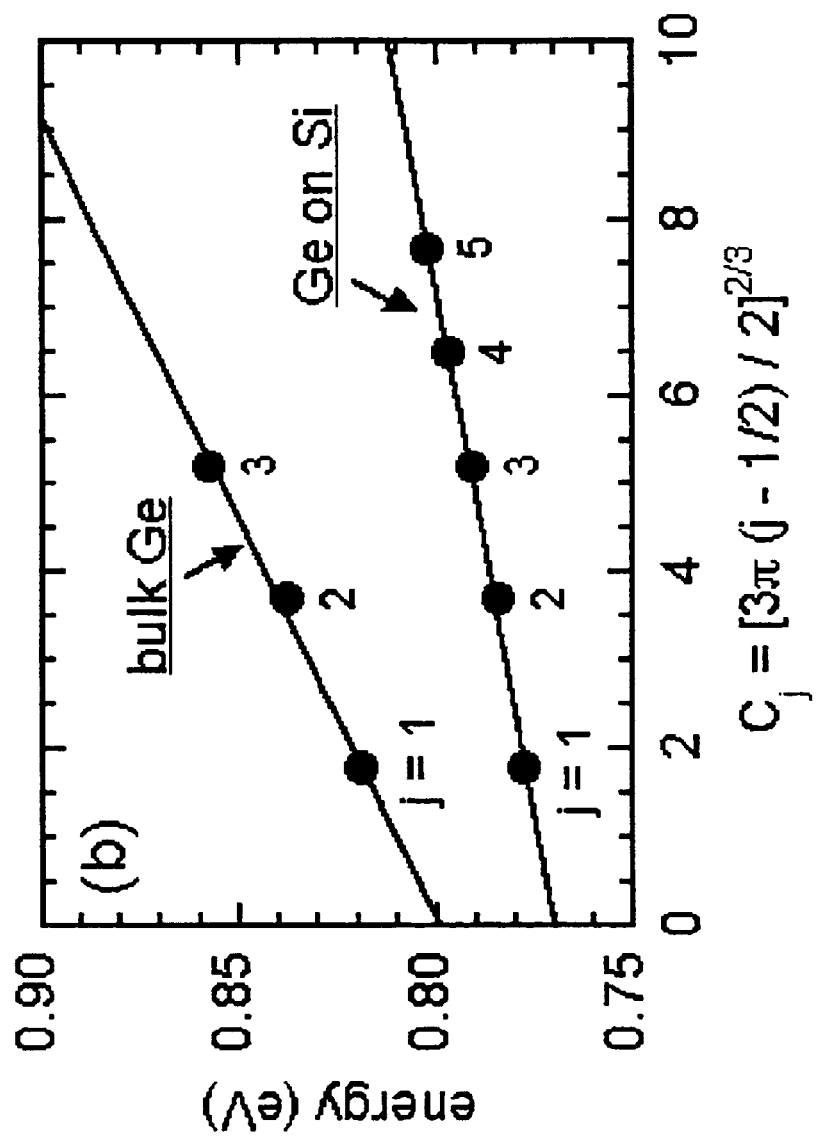
FIG. 4 is a graph of an optical bandgap of a Ge epilayer and a bulk Ge analyzed using photoreflectance spectroscopy.

FIG. 4 is a graph of an optical bandgap of a Ge epilayer and a bulk Ge analyzed using photoreflectance spectroscopy. The vertical axis is associated with bandgap energy and the horizontal axis is associated with the a constant value $C_j=[3\pi(j-\frac{1}{2})/2]^{2/3}$, where j is an integer value that denotes the number of peaks and valleys in the spectrum counted from the longer wavelength. Overall, the graph demonstrates that a Ge epilayer grown at 700° C. and then heated up to 900° C., using the annealed steps described previously, and cooled rapidly shows a narrower bandgap than bulk Ge. Furthermore, the graph illustrates throughout a large span of j values (1–5), the bandgap is consistent with a structure in the C-band and L-band and rarely fluctuates over the 0.75 eV bandgap. The bulk Ge structure shows a structure that fluctuates across a small range of j values (1–3), thus not making this structure useful in the C-band and L-band.

FIG. 5 is a graph demonstrating the tensile strain in Ge shrinking its direct bandgap (Eg). The theoretical limit of Eg shrinkage is 0.757 eV corresponding to 1638 nm, which is beyond the L-band edge (1608 nm) of Er amplifiers. The maximum strained accumulated during the cooling process previously discussed is 0.0032 based on the reported expansion coefficients of Ge and Si. The tensile strain of Ge can function as a universal photodetector for the S+C+L bands of Er doped amplifiers. The same properties can also be seen using a tensile strain SiGe layer.

Figure 6:
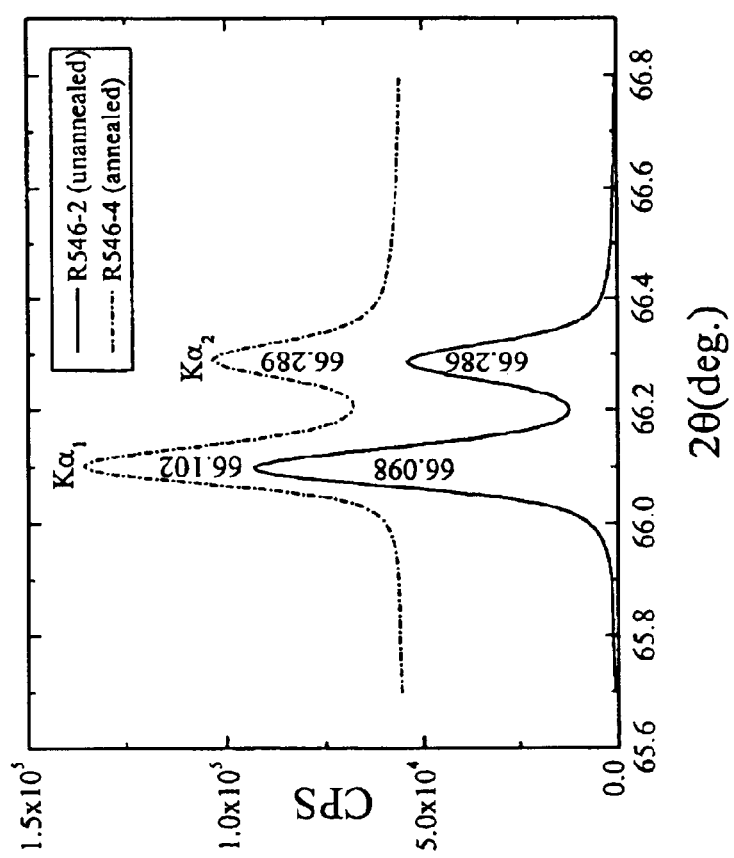
FIG. 6 is a X-ray locking curve measurement of the annealed tensile Ge epilayer.

FIG. 6 is a X-ray locking curve measurement of the annealed tensile Ge epilayer. The X-ray locking measurement includes both a tensile Ge epilayer and an unannealed Ge layer, and measures the wavelength of an X-ray arriving at the sampled at a specified angle. This establishes the lattice constant of the samples. FIG. 5 shows that the lattice constant of the Ge epilayer is indeed larger than bulk Ge by 0.2%.

Another technique to more effectively utilize the thermal mismatch in the Ge epilayers is to grow Ge on a substrate called "Si on Quartz". Since the lattice constant expansion coefficient of quartz is one order of magnitude smaller than Si, larger strain should be accumulated in the Ge epilayers. The invention is also applicable for SiGeC as well.

Furthermore, another advantage of this tensile strained Ge is its light hole band. The valence band now consists of light hole bands whose density of state is much smaller than the heavy hole bands. This results in lower saturation current in diode reverse characteristics, which are useful in photodetectors devices, and a faster drift velocity of holes. This is beneficial in the Ge photodetectors operating in the drift limited regime, not in RC limited regime. In the drift-limited regime, the device response time is limited by slow holes. However, light hole is as fast as electron in the F point, so the response time becomes the shortest.

Although the present invention has been shown and described with respect to several preferred embodiments thereof, various changes, omissions and additions to the form and detail thereof, may be made therein, without departing from the spirit and scope of the invention.

What is claimed is:

1. A method of forming a photonic device, the method comprising:
    growing a plurality of Ge epilayers at a high growth temperature on a substrate having a lattice expansion coefficient smaller than a lattice expansion coefficient of Ge;

annealing the Ge epilayers at an annealing temperature; and cooling the Ge epilayers to room temperature so as to form a tensilely strained Ge layer.

2. The method of claim 1, wherein the growth temperature is greater than 600° C.

3. The method of claim 2, wherein the growth temperature is greater than 700° C.

4. The method of claim 1, wherein growing the Ge epilayers comprises UHV-CVD.

5. The method of claim 4, wherein the UHV-CVD growth comprises use of $GeH_4$ as a deposition gas.

6. The method of claim 1, wherein annealing comprises cyclic thermal annealing.

7. The method of claim 6, wherein the cyclic thermal annealing is performed between annealing temperatures 700° C. and 900° C.

8. The method of claim 1, wherein the annealing temperature is higher than the growth temperature.

9. The method of claim 8, wherein annealing the epilayers comprises isothermal annealing.

10. The method of claim 9, wherein the annealing temperature during the isothermal annealing is about 900° C.

11. The method of claim 1, wherein cooling the epilayers comprises rapid cooling.

12. The method of claim 1, wherein the substrate comprises silicon.

13. The method of claim 12, wherein the substrate comprises heavily-doped p-type silicon.

14. The method of claim 1, wherein the substrate consists essentially of silicon.

15. The method of claim 1, wherein the photonic device comprises a photodetector device.

16. The method of claim 1, wherein the tensile strain of the Ge layer induces bandgap shrinkage of the Ge layer.

17. A method of forming a photonic device, the method comprising:

growing a plurality of Ge epilayers at a high growth temperature on a substrate having a lattice expansion coefficient smaller than a lattice expansion coefficient of Ge;

annealing the Ge epilayers at an annealing temperature; and cooling the Ge epilayers to room temperature so as to form a tensilely strained Ge layer, wherein the tensilely strained Ge layer shows bandgap shrinkage under tensile strain between about 0.2% and 0.32%.

18. A method of forming a photonic device, said method comprising:

growing a plurality of epilayers comprising SiGe at a high growth temperature on a substrate having a lattice expansion coefficient smaller than a lattice expansion coefficient of Ge;

annealing the epilayers at an annealing temperature; and cooling the epilayers to room temperature so as to form a tensilely strained layer comprising SiGe.

19. The method of claim 18, wherein the epilayers consist essentially of SiGe.

20. The method of claim 19, wherein the SiGe epilayers comprise a Ge concentration of at least 50%.

21. The method of claim 18, wherein the epilayers comprise SiGeC epilayers.

22. The method of claim 18, wherein the substrate comprises silicon.

23. The method of claim 18, wherein the substrate consists essentially of silicon.

24. The method of claim 18, wherein the growth temperature is greater than about 600° C.

25. The method of claim 24, wherein the growth temperature is greater than about 700° C.

26. The method of claim 18, wherein growing the epilayers comprises UHV-CVD.

27. The method of claim 18, wherein annealing the epilayers comprises isothermal annealing.

28. The method of claim 27, wherein the annealing temperature during the isothermal annealing is about 1330° C.

29. The method of claim 18, wherein cooling the epilayers comprises rapid cooling.

30. The method of claim 18, wherein the photonic device comprises a photodetector device.

31. The method of claim 18, wherein the tensile strain of the SiGe layer induces bandgap shrinkage of the SiGe layer.

32. A method of forming a photonic device, said method comprising:

growing a plurality of SiGe epilayers at a high growth temperature on a substrate having a lattice expansion coefficient smaller than a lattice expansion coefficient of Ge;

annealing the SiGe epilayers at an annealing temperature; and cooling the SiGe epilayers to room temperature so as to form a tensilely strained SiGe layer, wherein the tensilely strained SiGe layer shows bandgap shrinkage under tensile strain between about 0.2% and 0.32%.

* * * * *